(12) United States Patent
Hayata

(10) Patent No.: US 6,683,731 B2
(45) Date of Patent: Jan. 27, 2004

(54) BONDING APPARATUS

(75) Inventor: Shigeru Hayata, Tachikawa (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 10/325,991

(22) Filed: Dec. 19, 2002

(65) Prior Publication Data
US 2003/0123866 A1 Jul. 3, 2003

(30) Foreign Application Priority Data

Dec. 28, 2001 (JP) ........................................ 2001-400285

(51) Int. Cl.[7] .................... G02B 13/00; G01B 11/26; G01B 11/14; G01B 11/00; G01N 21/86
(52) U.S. Cl. ................. 359/744; 356/153; 356/399; 356/400; 356/615; 228/105; 250/559.34
(58) Field of Search ................. 359/744, 885; 356/153, 399, 400, 615; 700/58; 250/559.08, 559.29, 559.33, 559.34; 228/105, 102, 103, 25, 4.5, 49.1

(56) References Cited

U.S. PATENT DOCUMENTS 5,566,876 A * 10/1996 Nishimaki et al. .......... 228/102
6,337,489 B1 * 1/2002 Matsumoto et al. ... 250/559.08
6,449,516 B1 * 9/2002 Kyomasu et al. ............. 700/58
6,464,126 B2 * 10/2002 Hayata et al. .............. 228/105
2003/0098426 A1 * 5/2003 Hayata .................. 250/559.34
2003/0099049 A1 * 5/2003 Hayata ....................... 359/885

FOREIGN PATENT DOCUMENTS

JP          2982000        9/1999
JP          2001-203234    7/2001

* cited by examiner

Primary Examiner—Georgia Epps
Assistant Examiner—Jack Dinh
(74) Attorney, Agent, or Firm—Koda & Androlia

(57) ABSTRACT

A bonding apparatus that includes a bonding tool through which a wire passes and which performs bonding on a workpiece, a position detection camera which takes images of the workpiece, a reference member which is disposed in a specified position, and an optical assembly which conducts the image of the tool and reference member to the position detection camera. A lens used in the position detection camera and a lens installed in the optical assembly are arranged so that such lenses construct an afocal optical system.

3 Claims, 5 Drawing Sheets

BONDING APPARATUS

BACKGROUND OF THE INVENTION

1. Field of the Invention

The present invention relates to a bonding apparatus and more particularly to a bonding apparatus that calculates the amount of offset between a bonding tool and a position detection camera that takes images of a workpiece.

2. Prior Art

Manufacturing process of semiconductor assemblies such as ICs, etc. includes a wire bonding steps. In such bonding steps, a wire 4 is, as shown in FIG. 7, connected to a pad (a first bonding point) 1a of the semiconductor chip 1 of a workpiece 3 and a lead (second bonding point) 2a of a lead frame 2.

The above wire bonding steps are performed by, for instance, a wire bonding apparatus 10 shown in FIG. 8.

First, a deviation from normal positions of at least two fixed points on a semiconductor chip 1 and at least two fixed points on a lead frame 2 is detected by a position detection camera 11, and bonding coordinates stored in memory (not shown) beforehand are corrected based upon such detected values. When this detection is done by the position detection camera 11, an X-axis motor 12 and a Y-axis motor 13 are first driven so that the optical axis 11a of the position detection camera 11 is positioned directly above a measurement point. After the bonding coordinates are corrected as described above, a bonding tool (called "tool") 5 is moved in the directions of the X and Y axes (or moved horizontally) and in the direction of the Z axis (or moved vertically), and a wire 4 that passes through the tool 5 is wire-bonded to the first bonding point 1a and the second bonding point 2a.

In the above structure, the optical axis 1a of the position detection camera 11 and the axial center 5a of the tool 5 are offset by a distance W. Accordingly, after the deviation of the fixed points is detected by the position detection camera 11 and the bonding coordinates are corrected, the XY table 15 is moved by an amount equal to the offset amount W by the X-axis motor 12 and Y-axis motor 13, thus positioning the tool 5 above the first bonding point 1a. Afterward, the wire 4 is wire-bonded at the above-described corrected bonding coordinates by the movement of the XY table 15 in the directions of the X and Y axes by the X-axis motor 12 and Y-axis motor 13 and by the movement of the tool 5 in the direction of the Z axis by the vertical movement (or swinging movement) of the bonding arm 16 caused by the Z-axis motor 14.

In FIG. 8, the bonding arm 16 is disposed on a bonding head 17 so that the bonding arm 16 is free to swing, and the position detection camera 11 is fastened to the bonding head 17 via a camera holding arm 18. Xw refers to an X-axis component of the offset amount W, and Yw refers to a Y-axis component of the offset amount W.

The position detection camera 11 is for determining the reference points for ascertaining the position to which the tool 5 is moved. Accordingly, it is extremely important to know exactly how far the position detection camera 11 is offset from the tool 5. However, the actual offset amount varies from instant to instant as a result of thermal expansion of the camera holding arm 18 and bonding arm 16 caused by radiant heat from the high-temperature bonding stage and heat transferred from the heated air. Accordingly, it is necessary to correct the offset amount when bonding work is initiated and at an appropriate timing during intervals between bonding operations.

Japanese Patent No. 2982000 (Japanese Patent Application Laid-Open (Kokai) No. 2000-021923), for instance, discloses a conventional means for determining an accurate offset amount. However, this offset amount determining means requires a special offset correction camera used for offset correction in addition to the position detection camera that detects the positions of bonding points. Thus, the construction is complicated and expensive.

Japanese Patent Application Laid-Open (Kokai) No. 2001-203234 discloses a system that solves the above problems. In this system, an optical means that conducts image light of a tool and a reference member disposed in a specified position to a position detection camera is employed. As a result, the position detection camera that detects a position of the workpiece is used also for imaging the tool and reference member. Thus, this prior art shows that there is no need to use a special offset correction camera even in cases where a reference member is used.

The above-identified Japanese Patent Application Laid-Open (Kokai) No. 2001-203234 discloses various embodiments. One of the embodiments uses a telecentric lens as the lens of the position detection camera. The "telecentric lens" refers to a telecentric optical system or to an optical system which is constructed so that principal light rays that are focused as an image pass through the rear-side focal point of a lens. A telecentric lens has a broad tolerance range with respect to positional deviations in the direction that face the image focusing plane. Especially, even in a case in which transmitted light consisting of parallel light is illuminated, the size of the image (i.e., the distance from an optical axis) does not vary even if the object position fluctuates.

The optical system of the position detection camera in this prior art is similar to telecentric; strictly speaking, however, such an optical system is not telecentric; and if the object deviates from the focal position when the object is illuminated with parallel light, the image becomes more or less blurred.

SUMMARY OF THE INVENTION

The object of the present invention is to provide a bonding apparatus that can easily obtain a clear image regardless of the focal position when illumination is made with parallel light.

The above object is accomplished by a unique structure of the present invention for a bonding apparatus that comprises a bonding tool through which a wire passes and which performs bonding on a workpiece, a position detection camera which takes images of the workpiece, a reference member which is disposed in a specified position of the apparatus, and an optical means which conducts the image of the tool and reference member to the position detection camera; and in the present invention, an afocal system is employed which is constructed by a combination of a lens disposed in the position detection camera and a lens disposed in the optical means.

In the above structure, the afocal system is a Kepler type afocal system.

Instead, the afocal system can be a Galileo type afocal system.

DETAILED DESCRIPTION OF THE INVENTION

Figure 7:
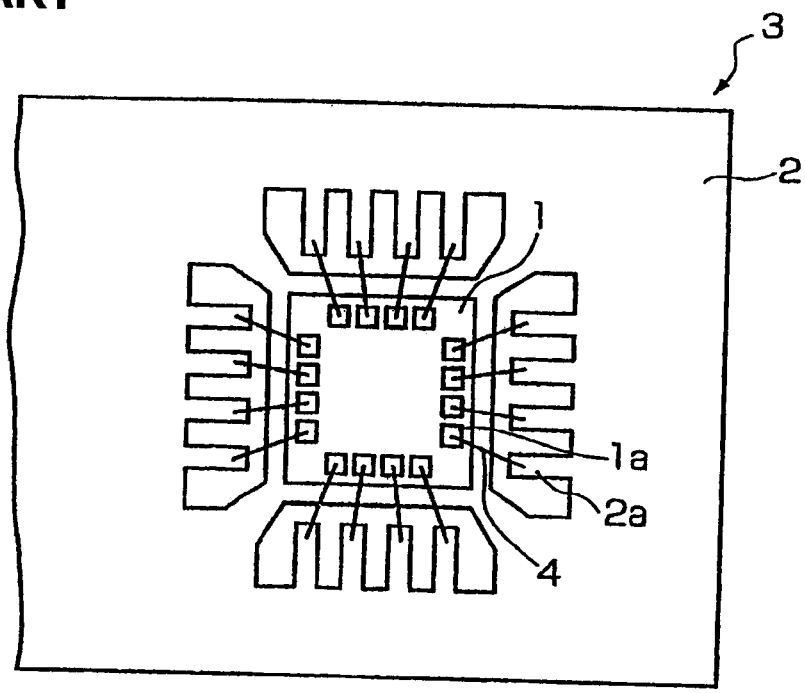
FIG. 7 is a top view of a wire-bonded workpiece.
Figure 8:
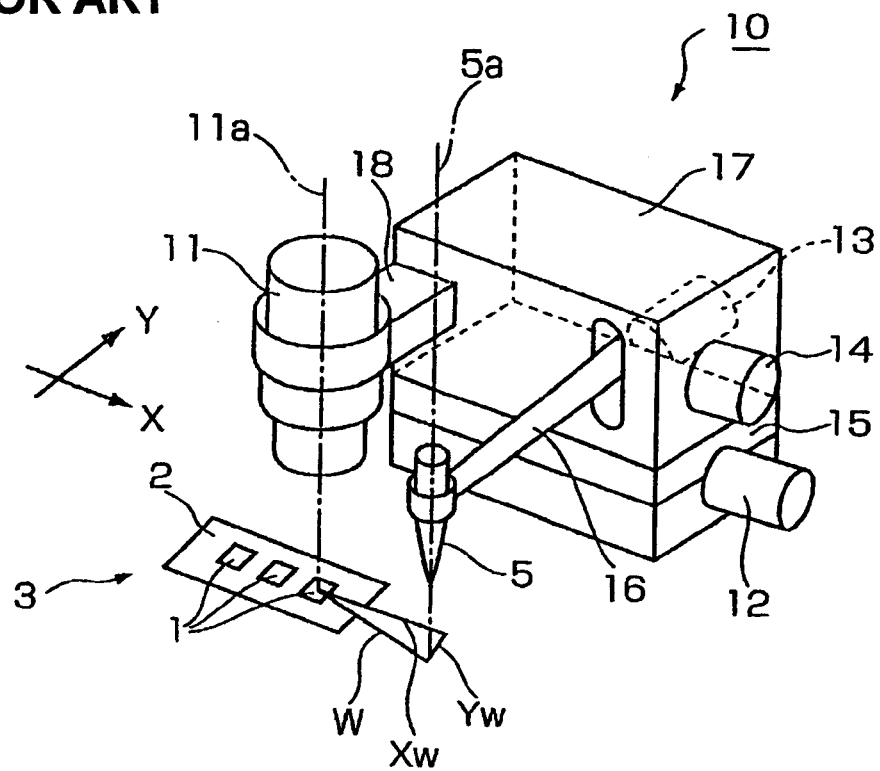
FIG. 8 is a perspective view of a wire bonding apparatus.

The first embodiment of the present invention will be described with reference to FIG. 1. Elements that are the same as those in FIGS. 7 and 8 or that correspond to those in FIGS. 7 and 8 are labeled with the same reference numerals, and a detailed description of such elements is omitted.

Figure 1:
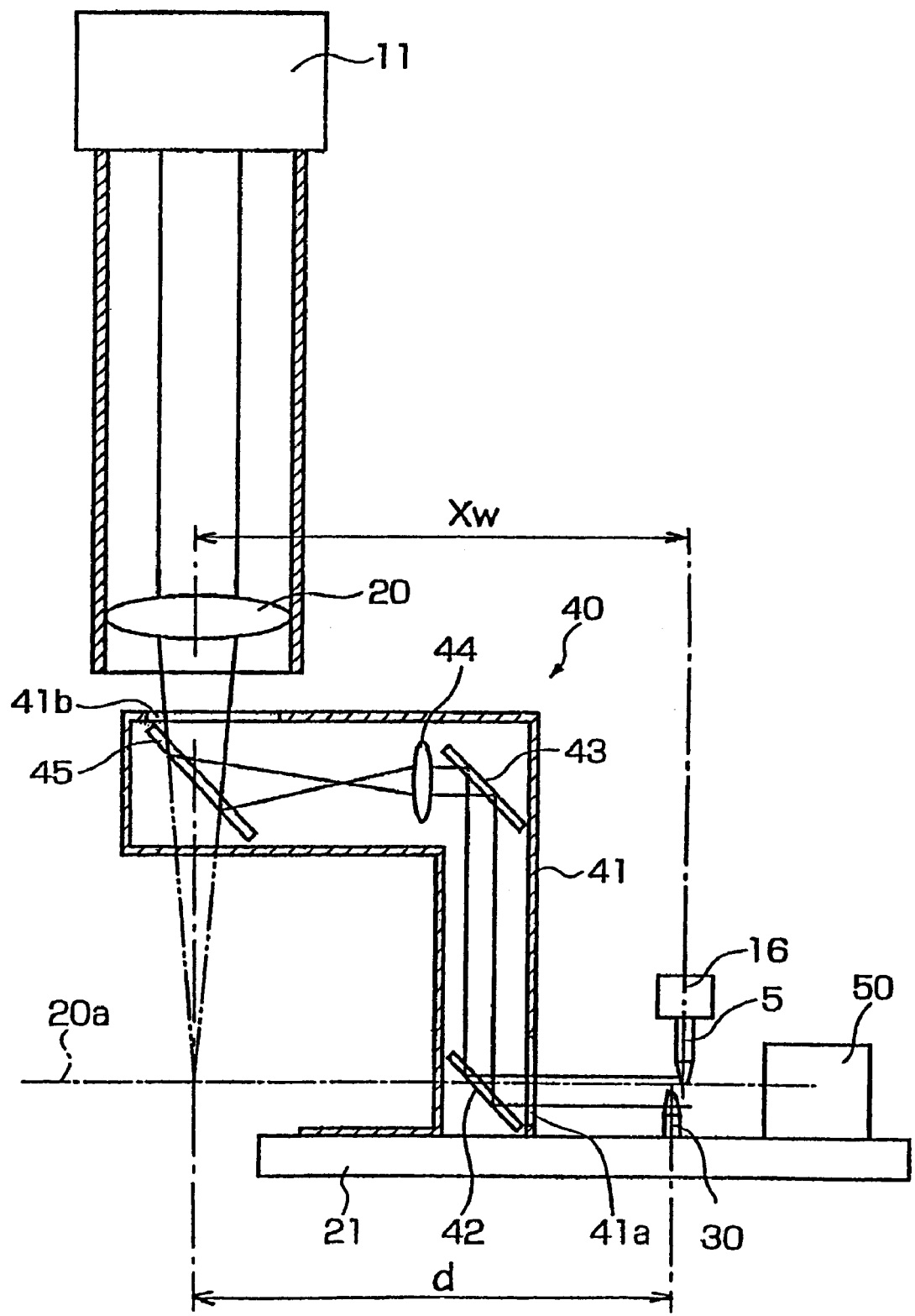
FIG. 1 shows, partially in cross section, the essential portion of the first embodiment of the bonding apparatus according to the present invention.

In FIG. 1, the position detection camera 11 is a photoelectric transducer type imaging device equipped with an imaging element (CCD, CMOS, etc.). The focal position of the lens (convex lens) 20 of the optical system of this position detection camera 11 is set so as to be on the workpiece level plane 20a. An optical means supporting plate 21 is disposed in the vicinity of a bonding stage (not shown) that positions and carries thereon a lead frame 2 shown in FIGS. 7 and 8. A reference member 30, an optical means 40 and an illuminating means 50 are disposed on the optical means supporting plate 21.

Inside the case 41 of the optical means 40, a first mirror 42, a second mirror 43, a lens (convex lens) 44 and a third mirror 45 are disposed. The first mirror 42 is disposed on the workpiece level plane 20a of the lens 20 so that the mirror 42 crosses the horizontal direction at an angle of 450°. The second mirror 43 is disposed above the third mirror 42, and it crosses the horizontal direction at an angle of −45°. The lens 44 is disposed on one side (on the left side in the shown embodiment) of the mirror 43, and the mirror 45 is disposed on one side (on the left side in the shown embodiment) of the lens 44 so that the mirror 45 crosses the horizontal direction at an angle of 45°. In addition, a first window 41a is formed in the case 41 so that the window 41a is on one side (or on the right side) of the mirror 42, and another (second) window 41b is formed in the case 41 so that it is above the mirror 45.

Furthermore, an illuminating means 50 which emits parallel illuminating light is disposed so as to face the mirror 42, and a reference member 30 is disposed between the mirror 42 and the illuminating means 50.

Here, the distance d between the center of the reflective surface of the mirror 45 and the reference member 30 is set so that this distance is substantially equal to the offset amount Xw in the direction of the X axis which is between the optical axis 11a of the position detection camera 11 and the axial center 5a of the tool 5.

Figure 2:
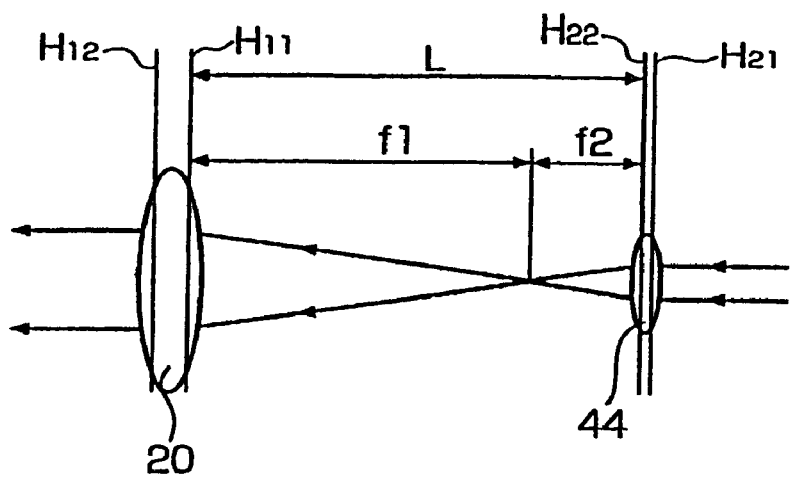
FIG. 2 is a simplified light path diagram in the structure of FIG. 1.

In the shown embodiment, a Kepler type afocal system is constructed by way of a combination of the (convex) lens 20 and the (convex) lens 44. FIG. 2 shows a simplified light path diagram of this Kepler type afocal system. In FIG. 2, f1 is the synthetic focal distance of the lens 20, H11 is the front-side principal plane of the lens 20, and H12 is the rear-side principal plane of the lens 20. Furthermore, f2 is the synthetic focal distance of the lens 44, H21 is the front-side principal plane of the lens 44, and H22 is the rear-side principal plane of the lens 44. Moreover, L is the distance from the front-side principal plane H11 of the lens 20 to the rear-side principal plane H22 of the lens 44. The afocal system is constructed by setting L so that L=f1+f2. Since the magnification is expressed by way of f1/f2, the value of f2 can be selected so that an appropriate magnification is obtained.

Next, the method for correcting the offset amount W shown in FIG. 8 will be described. The correction method itself is the same as a conventional method. FIG. 1 shows a case in which the offset amount Yw in the direction of the Y axis is corrected.

First, the XY table 15 shown in FIG. 8 is driven so that the axial center 5a of the tool 5 is positioned above the reference member 30. Then, the Z-axis motor 14 is driven so that the tool 5 is lowered to a height where the tool 5 almost touches the reference member 30. Here, it is sufficient if the position detection camera 11 is in a position that allows imaging of the tool 5 and reference member 30 to be made, and it is not necessary to cause the axial center Sa of the tool 5 to coincide with the axial center of the reference member 30.

Figure 4A:
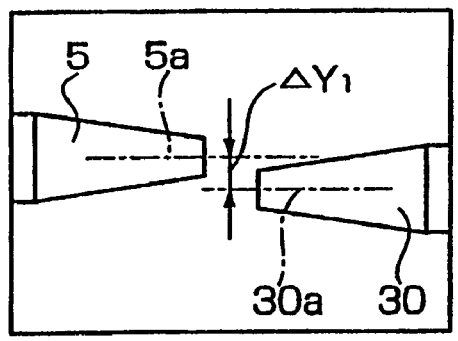
FIGS. 4A and 4B are explanatory diagrams of the images in which the tool is positioned in close proximity to the reference member.

Next, both the tool 5 and reference member 30 are imaged. The image of the tool 5 and reference member 30 is (as shown in FIG. 1) reflected by the first and second mirrors 42 and 43, passes through the lens 44 and is reflected by the mirror 45, so that the image shown in FIG. 4A is acquired by the position detection camera 11 through the lens 20. The deviation ΔY1 between the axial center 5a of the tool 5 and the axial center 30a of the reference member 30 in the direction of the Y axis is calculated by subjecting the image to appropriate image processing.

The XY table 15 is next driven in accordance with the offset amounts Xw and Yw stored beforehand in memory (not shown), thus moving the position detection camera 11 to the vicinity of the reference member 30. Then, the reference member 30 is imaged in this state, and the deviation ΔY2 between the axial center 30a of the reference member 30 and the optical axis 11a of the position detection camera 11 is calculated by subjecting the image to appropriate image processing. Finally, the offset correction amount ΔY is calculated by Numerical Expression 1 below from the measured values of ΔY1 and ΔY2 in the same manner as in the conventional method.

$$\Delta Y = \Delta Y1 - \Delta Y2 \qquad \text{Numerical Expression 1}$$

As seen from the above, in the shown embodiment of the present invention, since the Kepler type afocal system is constructed by a combination of the lens 20 and lens 44, when the parallel light of the image of the tool 5 and reference member 30 is incident on the lens 44, then this light is emitted to the position detection camera 11 through the lens 20 as completely parallel light. Accordingly, a clear image is obtained regardless of the focal position of the lens 44. In other words, a clear image is obtained regardless of the positions of the tool 5 and reference member 30 in the horizontal direction.

The second embodiment of the present invention will be described with reference to FIG. 3. In the second embodiment, the object (tool 5 and reference member 30) shown in FIG. 1 is observed from two directions, i.e. from the X and Y axes directions. More specifically, in this second embodiment, a half-mirror 46, fourth and fifth mirrors 47 and 48 and a second illuminating means 51 are provided in the optical means 40 in addition to the structure of the first embodiment shown in FIG. 1.

Figure 3:
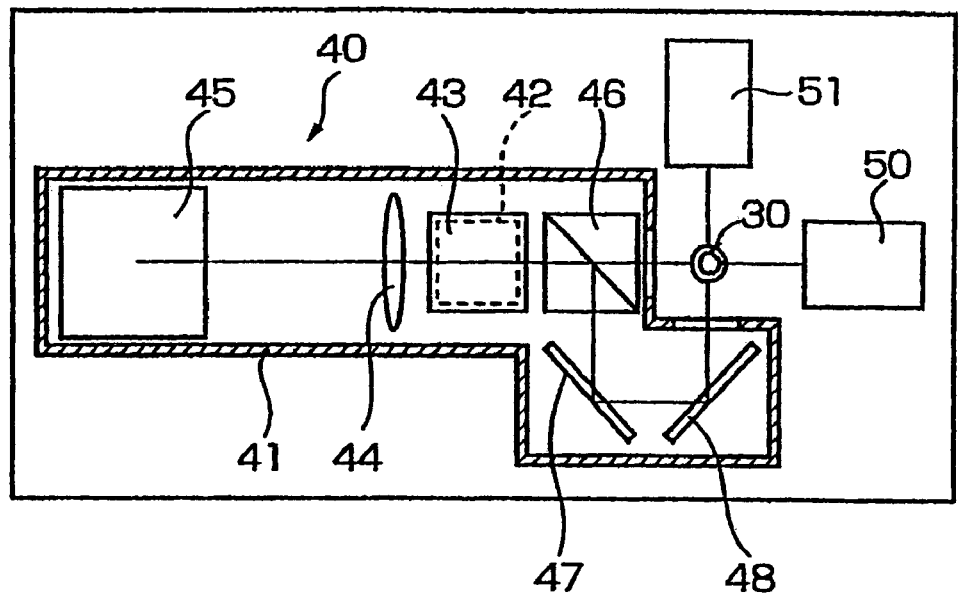
FIG. 3 is an explanatory top view of the second embodiment of the bonding apparatus according to the present invention.

In FIG. 3 which is a view seen from above, the half-mirror 46 is disposed on the right side of the mirror 42, and the illuminating means 50 is disposed so as to face the half-mirror 46 with the reference member 30 in between. Fourth mirror 47 is disposed on the lower side (with respect to the arrangement in FIG. 3) of the half-mirror 46 (the mirror 47 is thus on the same horizontal plane as the half-mirror 46), and fifth mirror 48 is disposed on the right side of the mirror 47. The illuminating means 51 is disposed so as to face the fifth mirror 48 with the reference member 30 in between. The reflective surface of the fourth mirror 47 and the reflective surface of the mirror 46 are oriented parallel to each other, and both of these reflective surfaces cross the direction of the X axis at an angle of 45°. The reflective surface of the mirror 48 crosses the direction of the X axis at an angle of −45°.

Next, the correction of the offset amount W (Yw, Yw) will be described.

An operation similar to that performed in the above-described embodiment is performed, and the tool 5 is lowered to a height where the tool 5 almost touches the reference member 30. Then, both the tool 5 and the reference member 30 are imaged by the position detection camera 11, and the positional relationship of the two, i.e., ΔX1, ΔY1, is measured.

First, the illuminating means 51 is turned off and the illuminating means 50 is lit; as a result, the image of the tool 5 and reference member 30 in the direction of the Y axis passes through the half-mirror 46 and is reflected by the mirrors 42 and 43 as a shadow with respect to the light from the illuminating means 50; and this image passes through the lens 44 and is reflected by the mirror 45, so that the image in the direction of the Y axis shown in FIG. 4A is acquired by the position detection camera 11 through the lens 20 shown in FIG. 1. The deviation ΔY1 between the axial center 5a of the tool 5 and the axial center 30a of the reference member 30 in the direction of the Y axis is calculated by subjecting this image to appropriate image processing.

Figure 4B:
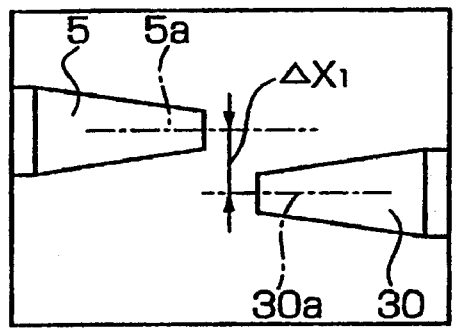

Next, the illuminating means 50 is turned off and the illuminating means 51 is lit; as a result, the image of the tool 5 and reference member 30 in the direction of the X axis is reflected by the mirrors 48 and 47 and reflected by the reflective surface of the half-mirror 46 as a shadow with respect to the light from the illuminating means 51; and this image is then reflected by the mirrors 42 and 43, after which the image passes through the lens 44 and is reflected by the mirror 45, so that the image in the direction of the X axis shown in FIG. 4B is acquired by the position detection camera 11 through the lens 20. The deviation ΔX1 between the axial center 5a of the tool 5 and the axial center 30a of the reference member 30 in the direction of the X axis is calculated by subjecting this image to appropriate image processing.

When the positional relationship between the tool 5 and reference member 30, i.e., the relationship of ΔX1 and ΔY1, has thus been measured, the XY table 15 is next driven in accordance with the offset amounts Xw and Yw stored beforehand in memory (not shown), so that the position detection camera 11 is caused to move to the vicinity of the reference member 30. Then, in this state, the reference member 30 is imaged, and the deviations ΔX2 and ΔY2 between the axial center 30a of the reference member 30 and the optical axis 11a of the position detection camera 11 are calculated by subjecting this image to appropriate image processing. The offset correction amounts ΔX and ΔY can be calculated by Numerical Expression 2 below from the measured values of ΔX1, ΔY1 and the measured values of ΔX2, ΔY2 in the same manner as in the conventional method.

$$\Delta X = \Delta X1 - \Delta X2$$

$$\Delta Y = \Delta Y1 - \Delta Y2 \qquad \text{Numerical Expression 2}$$

Since the above second embodiment is an afocal system, it is not necessary that the light path of the illuminating means 50 from the reference member 30 to the lens 44 and the light path of the illuminating means 51 from the reference member 30 to the lens 44 be made equal in a case where observation is performed from two directions, i.e., the directions of the X and Y axes. In other words, there are no restrictions on the spacing of the half-mirror 46, fourth and fifth mirrors 47 and 48, etc. The embodiment is extremely advantageous when mounted in a bonding apparatus.

Figure 5:
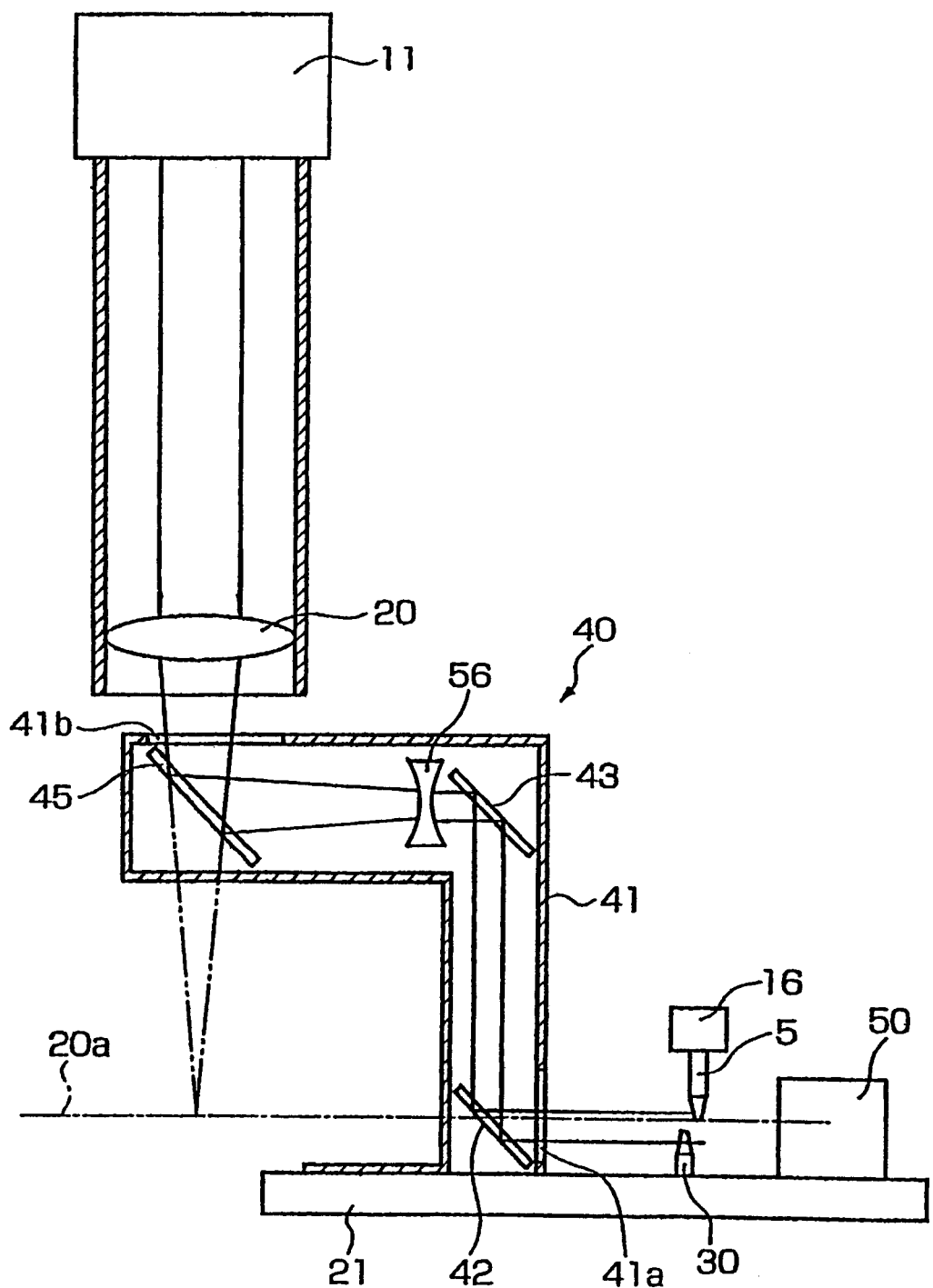
FIG. 5 shows, partially in cross section, the essential portion of the third embodiment of the bonding apparatus according to the present invention.

The third embodiment of the present invention will be described with reference to FIG. 5. In the third embodiment, a lens (concave lens) 56 is used instead of the lens (convex lens) 44 used in the first embodiment shown in FIG. 1; and thus a Galileo type afocal system is constructed by the combination of the (convex) lens 20 and the (concave) lens 56. The simplified light path diagram of this Galileo type afocal system is shown in FIG. 6.

Figure 6:
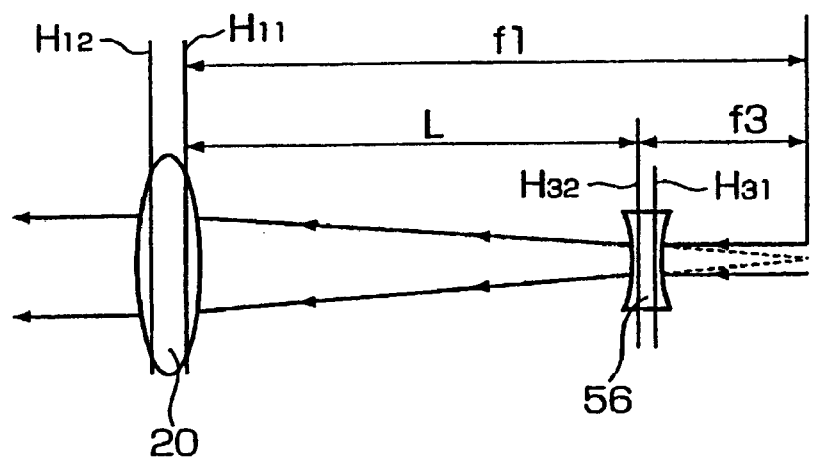
FIG. 6 is a simplified light path diagram in the structure of FIG. 5.

In FIG. 6, f1 is the synthetic focal distance of the lens 20, H11 is the front-side principal plane of the lens 20, and H12 is the rear-side principal plane of the lens 20. Furthermore, f3 is the synthetic focal distance of the lens 56, H31 is the front-side principal plane of the lens 56, and H32 is the rear-side principal plane of the lens 56. Moreover, L is the distance from the front-side principal plane H11 of the lens 20 to the rear-side principal plane H32 of the lens 56. The afocal system is constructed by setting L so that L=f1−f3. Since the magnification is expressed by way of f1/f3, the value of f3 is selected so that an appropriate magnification is obtained.

An effect substantially the same as that of the first embodiment shown in FIG. 1 is obtained in the structure of the third embodiment. Furthermore, in the third embodiment, by way of installing a half-mirror 46, additional mirrors 47 and 48 and an illuminating means 51 in the optical means 40 of FIG. 5 in the same manner as in the manner shown in FIG. 3, an observation of the object (tool 5 and reference member 30) from two directions, i.e., from the X and Y axes directions, can be accomplished in the same manner as described for the second embodiment.

In the respective embodiments described above and shown in FIGS. 1, 3 and 5, prisms can be used instead of the mirrors 42, 43, 45, 47 and 48.

As seen from the above, the present invention is for a bonding apparatus that includes a bonding tool through which a wire passes and which performs bonding on a workpiece, a position detection camera which images the workpiece, a reference member which is disposed in a specified position, and an optical means which conducts the image of the tool and reference member to the position detection camera; and in the present invention, an afocal system is constructed by a combination of a lens disposed in the position detection camera and a lens disposed in the optical means. Accordingly, a clear image can be simply obtained regardless of the focal position when the workpiece and the reference member are illuminated by parallel light.

What is claimed is:

1. A bonding apparatus comprising a tool through which a wire passes and which performs bonding on a workpiece, a position detection camera which images said workpiece, a reference member which is disposed in a specified position, and an optical means which conducts an image of said tool and reference member to said position detection camera, wherein an afocal system is constructed by a combination of a lens disposed in said position detection camera and a lens disposed in said optical means.

2. The bonding apparatus according to claim 1, wherein said afocal system is a Kepler type afocal system.

3. The bonding apparatus according to claim 1, wherein said afocal system is a Galileo type afocal system.

* * * * *